(12) United States Patent
Kuwabara

(10) Patent No.: US 12,542,357 B2
(45) Date of Patent: Feb. 3, 2026

(54) ANTENNA, ARRAY ANTENNA, SEMICONDUCTOR CHIP, AND WIRELESS APPARATUS

(71) Applicant: NEC Corporation, Tokyo (JP)

(72) Inventor: Toshihide Kuwabara, Tokyo (JP)

(73) Assignee: NEC CORPORATION, Tokyo (JP)

( * ) Notice: Subject to any disclaimer, the term of this patent is extended or adjusted under 35 U.S.C. 154(b) by 38 days.

(21) Appl. No.: 18/772,230

(22) Filed: Jul. 14, 2024

(65) Prior Publication Data
US 2025/0055193 A1     Feb. 13, 2025

(30) Foreign Application Priority Data
Aug. 10, 2023  (JP) .................. 2023-130628

(51) Int. Cl.
*H01Q 9/04* (2006.01)
*H01Q 1/38* (2006.01)

(52) U.S. Cl.
CPC .............. *H01Q 9/0407* (2013.01); *H01Q 1/38* (2013.01)

(58) Field of Classification Search
CPC .......... H01Q 9/0407; H01Q 1/38; H01Q 1/48; H01Q 1/2283
See application file for complete search history.

(56) References Cited

U.S. PATENT DOCUMENTS

2019/0341697 A1*  11/2019  Yamauchi ............... H01L 23/66

FOREIGN PATENT DOCUMENTS

WO      2011/078061 A1     6/2011

\* cited by examiner

*Primary Examiner* — David E Lotter
(74) *Attorney, Agent, or Firm* — Sughrue Mion, PLLC

(57) ABSTRACT

An antenna according to the present disclosure at least includes: a semiconductor substrate; a first wiring layer; an insulating layer; a second wiring layer; a first ground pattern formed in the first wiring layer to cover a part of a first region of a main surface of the semiconductor substrate; and a second ground pattern formed in the second wiring layer in such a way that a part of an outer peripheral side of the first ground pattern overlaps a part of an outer peripheral side of the second ground pattern, and a part of the second ground pattern overlapping the first ground pattern is connected to first signal wiring. The first ground pattern and the second ground pattern, are formed to gradually deviate from each other from a region where the first ground pattern overlaps the second ground pattern toward an end region of the semiconductor substrate.

10 Claims, 12 Drawing Sheets

ANTENNA, ARRAY ANTENNA, SEMICONDUCTOR CHIP, AND WIRELESS APPARATUS

INCORPORATION BY REFERENCE

This application is based upon and claims the benefit of priority from Japanese patent application No. 2023-130628, filed on Aug. 10, 2023, the disclosure of which is incorporated herein in its entirety by reference.

TECHNICAL FIELD

The present disclosure relates to an antenna, an array antenna, a semiconductor chip, and a wireless apparatus.

BACKGROUND ART

Antennas used for large-capacity communications using millimeter and sub-terahertz waves need to be designed so that their structural size is reduced in order to achieve high-frequency communication. However, there are limits to the reduction of the antenna size, making implementation of the antenna increasingly difficult. Additionally, the power loss when supplying power to the antenna through signal lines from a chip increases as a frequency of a wireless signal becomes higher. Solutions to such problems are disclosed, for example, in International Patent Publication No. WO2011/078061.

In International Patent Publication No. WO2011/078061, an antenna is formed on a semiconductor chip. This makes it possible to further miniaturize the antenna and reduce power loss.

In addition to the structure of the antenna disclosed in International Patent Publication NO. WO2011/078061, miniaturization of the antenna used for large-capacity communication using millimeter waves and sub-terahertz waves is required.

SUMMARY

One of objects of the present disclosure is to provide an antenna, an array antenna, a semiconductor chip, and a wireless apparatus which solve the above-mentioned problem.

A first example aspect of the present disclosure is an antenna at least including: a semiconductor substrate; a first wiring layer formed on a main surface of the semiconductor substrate; an insulating layer composed of an insulating film laminated on the first wiring layer; and a second wiring layer laminated on the insulating layer. The antenna further include: a first ground pattern formed in the first wiring layer to cover a part of a first region of the main surface of the semiconductor substrate; and a second ground pattern formed in the second wiring layer in such a way that a part of an outer peripheral side of the first ground pattern overlaps a part of an outer peripheral side of the second ground pattern when viewed from above, and the part of the second ground pattern overlapping the first ground pattern is electrically connected to first signal wiring extending from an integrated circuit. The first ground pattern and the second ground pattern, when viewed from above, are formed to gradually deviate from each other from a region where the first ground pattern overlaps the second ground pattern toward an end region of the semiconductor substrate.

BRIEF DESCRIPTION OF DRAWINGS

The above and other aspects, features, and advantages of the present disclosure will become more apparent from the following description of certain example embodiments when taken in conjunction with the accompanying drawings, in which.

EXAMPLE EMBODIMENT

First Example Embodiment

Figure 1:
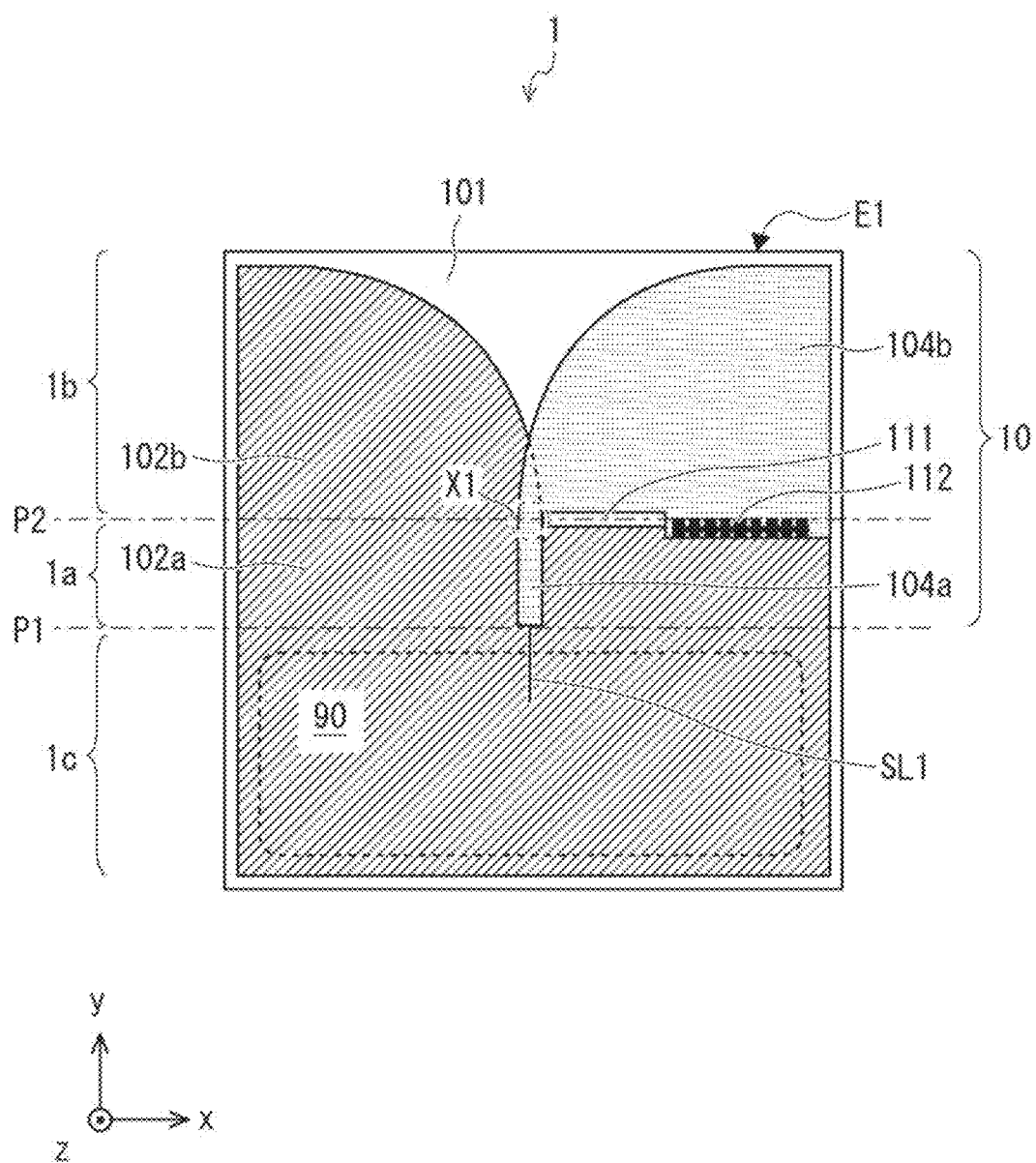
FIG. 1 is a top view showing a configuration example of a semiconductor chip on which an antenna according to the present disclosure is mounted.
Figure 2:
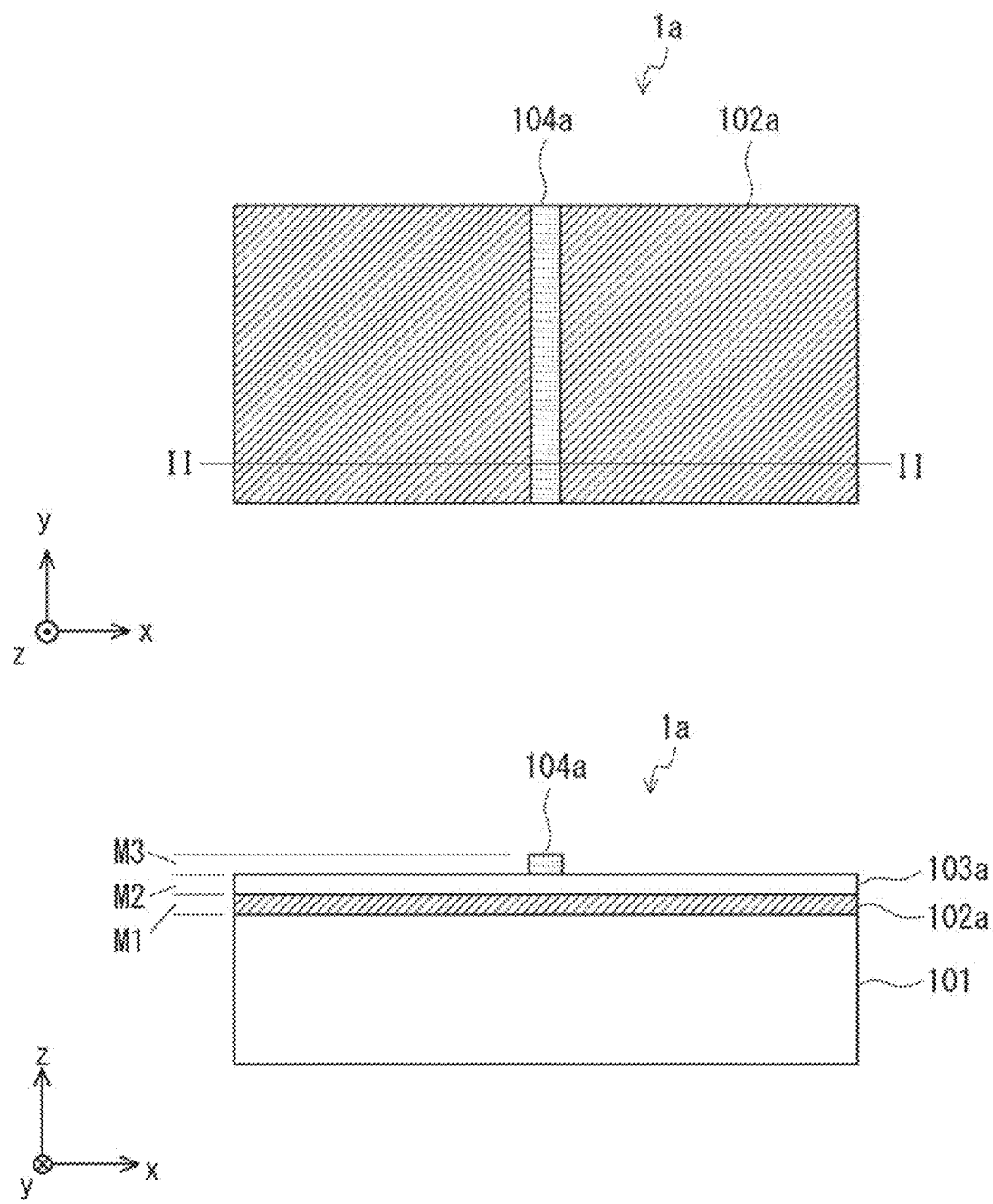
FIG. 2 is a top view and a cross-sectional view showing a more detailed configuration example of a region of the antenna in which a microstrip line is formed according to the present disclosure.
Figure 3:
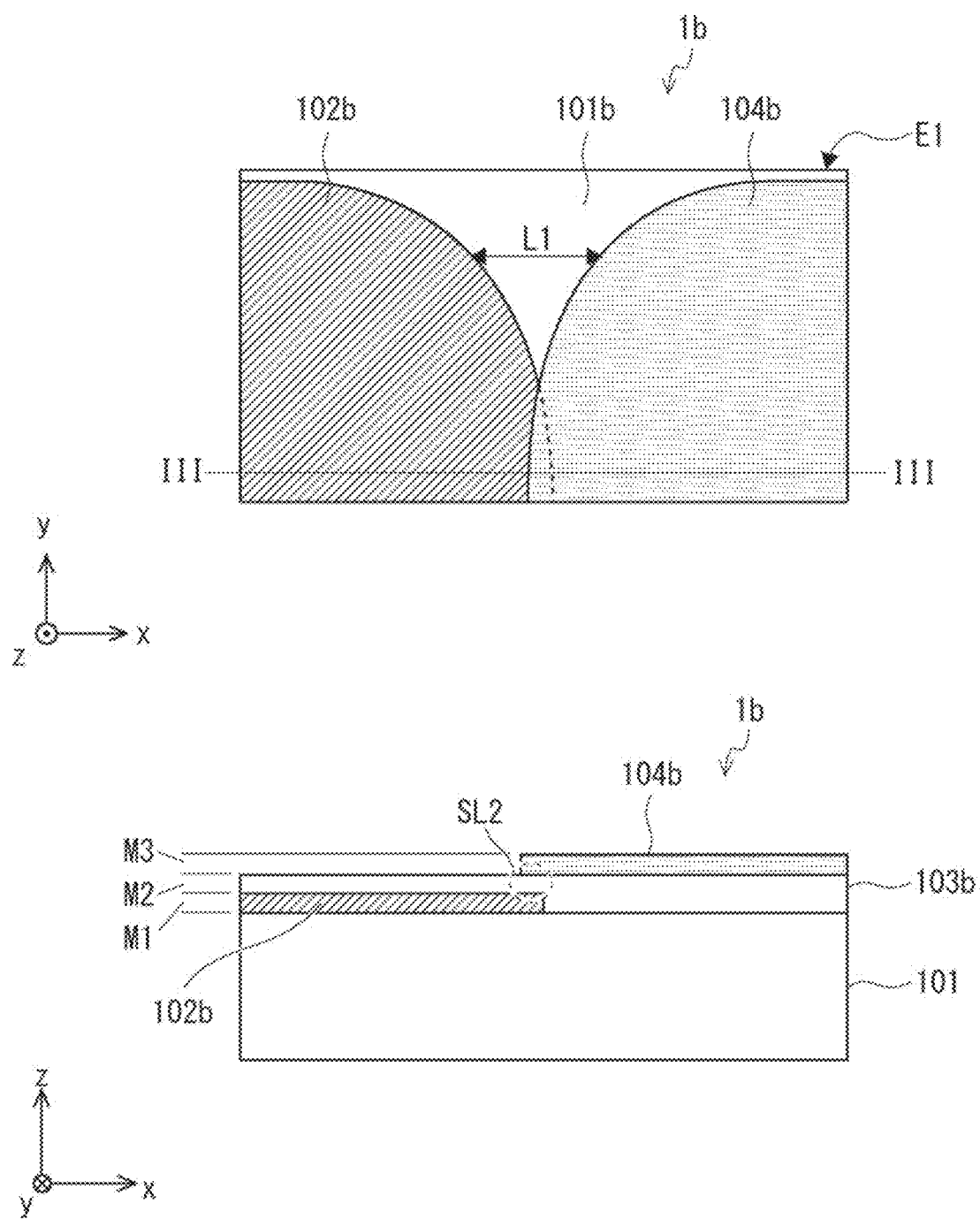
FIG. 3 is a top view and a cross-sectional view showing a more detailed configuration example of a region of the antenna in which a slot line is formed according to the present disclosure.

FIG. 1 is a top view showing a configuration example of a semiconductor chip 1 on which an antenna 10 according to the present disclosure is mounted. FIG. 2 is a top view and a cross-sectional view showing a more detailed configuration example of a region 1a of the antenna 10 in which a microstrip line is formed. The upper drawing of FIG. 2 is a top view of the region 1a, and the lower drawing of FIG. 2 is a cross-sectional view taken along the line II-II of the top view of the region 1a. In the top view of FIG. 2, an insulating film 103a formed in an insulating layer M2 is omitted. FIG. 3 is a top view and a cross-sectional view showing a more detailed configuration example of a region 1b of the antenna 10 in which a slot line is formed. The upper drawing of FIG. 3 is a top view of the region 1b, and the lower drawing of FIG. 3 shows a cross-sectional view taken along the line III-III of the top view of the region 1b. In the top view of FIG. 3, the insulating film 103b formed in the insulating layer M2 is omitted.

As shown in FIGS. 1 to 3, the semiconductor chip 1 includes at least a semiconductor substrate 101, a first wiring layer M1 formed on the main surface of the semiconductor substrate 101, the insulating layer M2 laminated on the first wiring layer M1, and a second wiring layer M3 laminated on the insulating layer M2. Although this example embodiment will be described by way of example when the three layers M1 to M3 are provided on the main surface of the semiconductor substrate 101, it is not limited to this case and where four or more layers may be provided.

The semiconductor substrate 101 is formed of a semiconductor material such as silicon or gallium arsenide. The first wiring layer M1 is a layer on which a ground pattern is formed. A ground pattern is a metal film such as copper having a predetermined shape connected to the ground. The insulating layer M2 is a layer on which an insulating film is formed. The second wiring layer M3 is a layer on which signal wiring is mainly formed. In the second wiring layer M3, a ground pattern for forming a slot line, which will be described later, is also formed.

On the main surface of the semiconductor substrate 101, a region 1c in which an integrated circuit 90 is disposed, the region 1a in which the microstrip line is formed (second region), and a region 1b in which the slot line is formed (first region) are provided. The antenna 10 is composed of the microstrip line formed in the region 1a and the slot line formed in the region 1b.

Next, the structure of the region 1a in which the microstrip line is formed will be described with reference to FIGS. 1 and 2. In the region 1a, a ground pattern (third ground pattern) 102a is formed in the first wiring layer M1 to cover the entire main surface of the region 1a of the main surface of the semiconductor substrate 101. The insulating film 103a is formed in the insulating layer M2 to cover the ground pattern 102a. In the second wiring layer M3, signal wiring 104a is formed, extending from the region 1c where the integrated circuit 90 is arranged to the region 1b where the slot line is formed. The signal wiring 104a formed in the region 1a serves as a microstrip line for transmitting wireless signals received from signal wiring SL1 of the integrated circuit 90 to the slot line formed in the region 1b.

Next, a structure of the region 1b in which the slot line is formed will be described with reference to FIGS. 1 and 3. In the region 1b, a ground pattern (first ground pattern) 102b is formed in the first wiring layer M1 to cover a part of the main surface of the region 1b of the main surface of the semiconductor substrate 101. The insulating film 103b is formed in the insulating layer M2 to cover the entire main surface of the region 1b including the ground pattern 102b. A ground pattern (second ground pattern) 104b is formed in the second wiring layer M3 in such a way that a part of the outer peripheral side of the ground pattern 102b overlaps a part of the outer peripheral side of the ground pattern 104b when viewed from above (viewed in the z-axis direction), and the part of the ground pattern 104b overlapping the ground pattern 102b is electrically connected to the signal wiring 104a of the region 1a. A gap SL2 formed between the ground pattern 102b and the ground pattern 104b serves as a slot line for transmitting the wireless signals received from the signal wiring 104a of the region 1a.

Referring to FIG. 1, the ground pattern 102a formed in the first wiring layer M1 of the region 1a is electrically connected to the ground pattern 104b formed in the second wiring layer M3 of the region 1b by vias 112 near a boundary line P2 between the regions 1a and 1b. When viewed from above, a gap 111 is provided between a connection point X1 between the signal wiring 104a and the ground pattern 104b and a connection point (a region where the vias 112 are formed) between the ground pattern 102a and the ground pattern 104b. The length of the gap 111 in the x-axis direction is, for example, ¼ wavelength of a wireless signal.

Here, the ground patterns 102b and 104b, when viewed from above, are formed to gradually deviate from each other from the part where the ground pattern 102b overlaps the ground pattern 104b toward a region of a chip end E1 of the semiconductor substrate 101. In other words, the ground patterns 102b and 104b are formed in such a way that the gap SL2 becomes larger (i.e., in such a way that a distance L1 between the outer peripheries of the ground patterns 102b and 104b in the x-axis direction becomes longer) from the central part of the semiconductor chip 1 to an end region thereof. Therefore, when power is supplied to the slot line, an electric field is generated in the gap SL2, and a magnetic field is generated in the vertical direction (z-axis direction) of the semiconductor chip, so that the slot line can function as an antenna. That is, the slot line formed in the region 1b functions not only as a transmission line for transmitting the wireless signals received from the signal wiring 104a formed in the region 1a, but also as an antenna for radiating the wireless signals from the chip end E1 to an external space.

As described above, the antenna 10 according to the present disclosure is formed on the semiconductor chip 1 in such a way that the gap of the slot line gradually increases from the central part of the chip toward the chip end. As a result, the antenna 10 can achieve a small-sized wireless apparatus capable of large-capacity communication using millimeter waves and sub-terahertz waves. Furthermore, since the antenna 10 can shorten the transmission path compared with the case where the antenna 10 is provided outside the semiconductor chip 1, power loss can be reduced and the number of components can be reduced.

Figure 4:
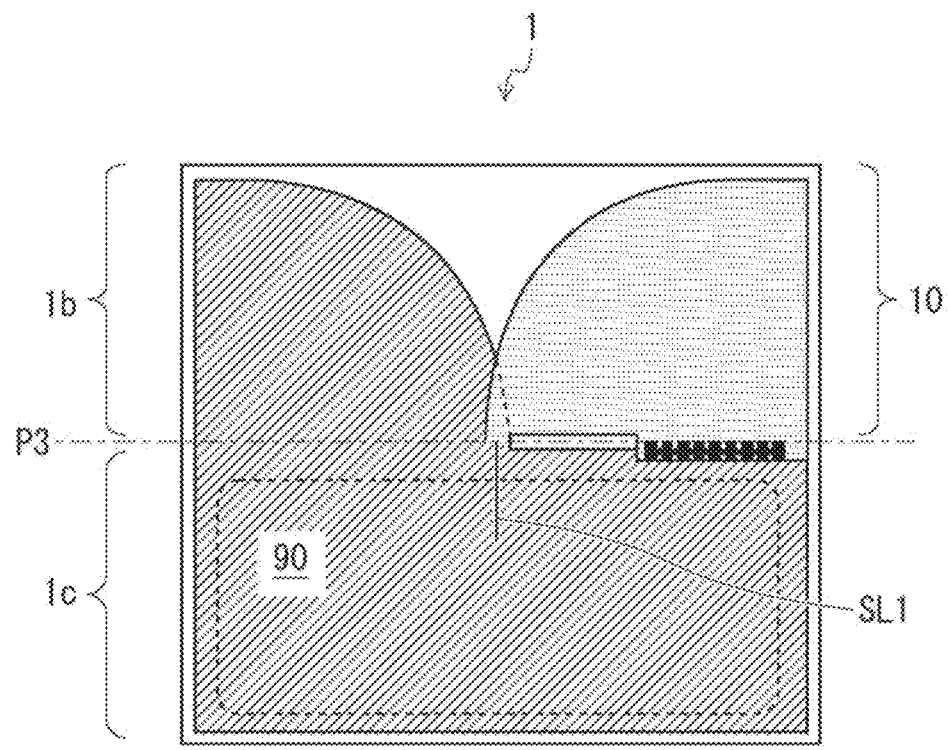
FIG. 4 is a top view showing a configuration example of a semiconductor chip in which an antenna according to a modified example of the present disclosure is mounted.

In this example embodiment, the case where the antenna 10 is composed of the microstrip line formed in the region 1a of the semiconductor chip 1 and the slot line formed in the region 1b of the semiconductor chip 1 has been described as an example, but this example embodiment is not limited to this. The antenna 10 may be composed of, for example, only a slot line formed in the region 1b of the semiconductor chip 1, as shown in FIG. 4, if it is possible to radiate wireless signals from the integrated circuit 90 to an external space.

(Example of Wireless Apparatus 100 to which Semiconductor Chip 1 is Applied)

Figure 5:
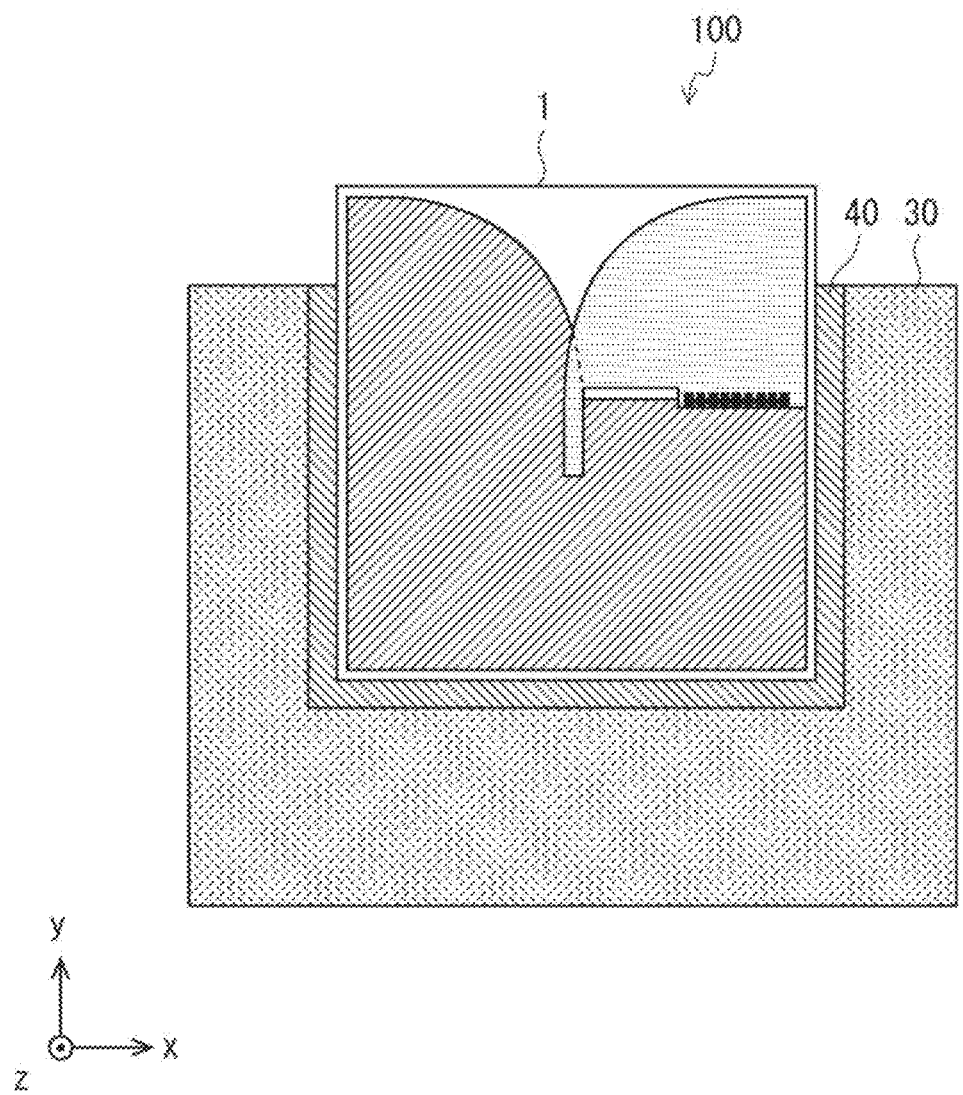
FIG. 5 is a top view showing a configuration example of a wireless apparatus in which the semiconductor chip according to the present disclosure is applied.
Figure 6:
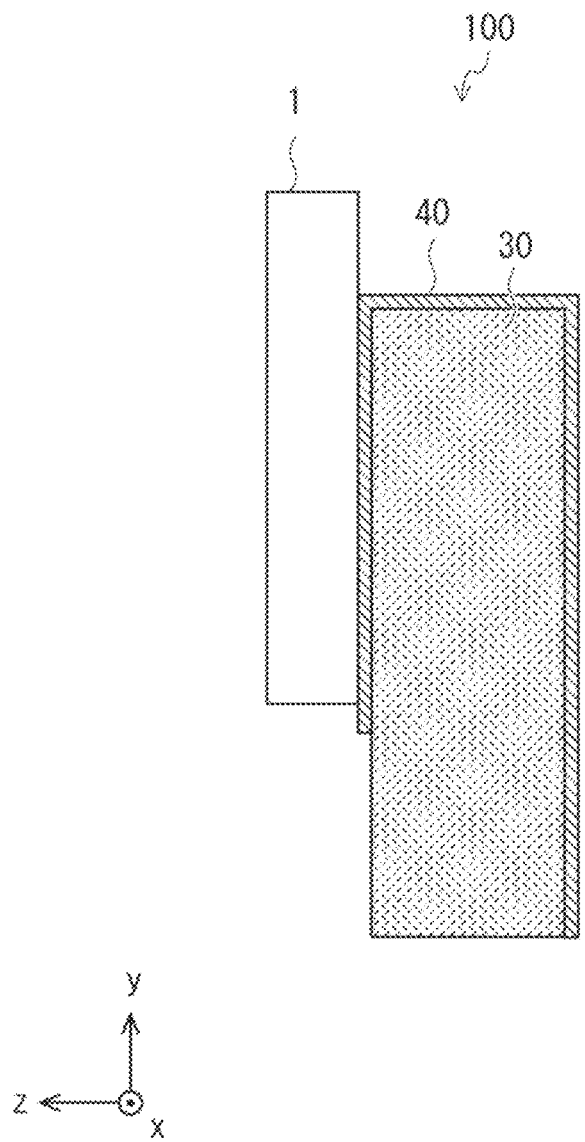
FIG. 6 is a side view showing a configuration example of a wireless apparatus in which the semiconductor chip according to the present disclosure is applied.

FIG. 5 is a top view showing a configuration example of a wireless apparatus 100 to which the semiconductor chip 1 is applied. FIG. 6 is a side view showing a configuration example of the wireless apparatus 100 to which the semiconductor chip 1 is applied.

Since the semiconductor chip 1 is formed of a dielectric material, a pattern of an electromagnetic field generated by the antenna 10 formed on the semiconductor chip 1 tends to be asymmetric in the vertical upward direction of the chip (z-axis positive direction) and the vertical downward direction of the chip (z-axis negative direction). Also, when the thickness of the semiconductor substrate 101 is large, a pattern of an electromagnetic field generated by the antenna 10 formed on the semiconductor chip 1 tends to be asymmetric in the vertical upward direction of the chip and the vertical downward direction of the chip. It also depends on the thickness of the semiconductor substrate 101 and the operating frequency, but in general, electromagnetic waves tend to be biased toward the side of the semiconductor substrate 101 with a high dielectric constant (i.e., downward direction of the chip). Therefore, there is a possibility that the radiation direction of the electromagnetic waves from the antenna 10 may not be directed toward the front of the chip end E1 (i.e., y-axis positive direction).

Therefore, in the wireless apparatus 100, the semiconductor chip 1 is provided on the ground layer 40 formed on a printed circuit board 30. This arrangement allows the ground layer 40 to serve as a reflection material of electromagnetic waves, enabling the antenna 10 provided on the semiconductor chip 1 to radiate wireless signals in a desired direction.

In the wireless apparatus 100, the semiconductor chip 1 is arranged to protrude from the end of the printed circuit board 30. By adjusting the amount of protrusion of the semiconductor chip 1, the pattern of the electromagnetic field generated by the antenna 10 can be adjusted to a desired pattern.

For example, as the thickness of the semiconductor substrate 101 is larger, the electromagnetic waves tend to be biased toward the side of the semiconductor substrate 101 (vertical downward direction of the chip), so it is preferable to reduce the amount of protrusion. On the other hand, the smaller the thickness of the semiconductor substrate 101, the smaller the bias of the electromagnetic waves toward the side of the semiconductor substrate 101, and therefore, it is preferable to increase the amount of protrusion.

Further, for example, the higher the operating frequency, the more susceptible it is to the bias of the electromagnetic waves, and therefore, it is preferable to reduce the amount of protrusion. On the other hand, the lower the operating frequency, the less susceptible it is to the bias of the electromagnetic waves, and therefore, it is preferable to increase the amount of protrusion.

Figure 7:
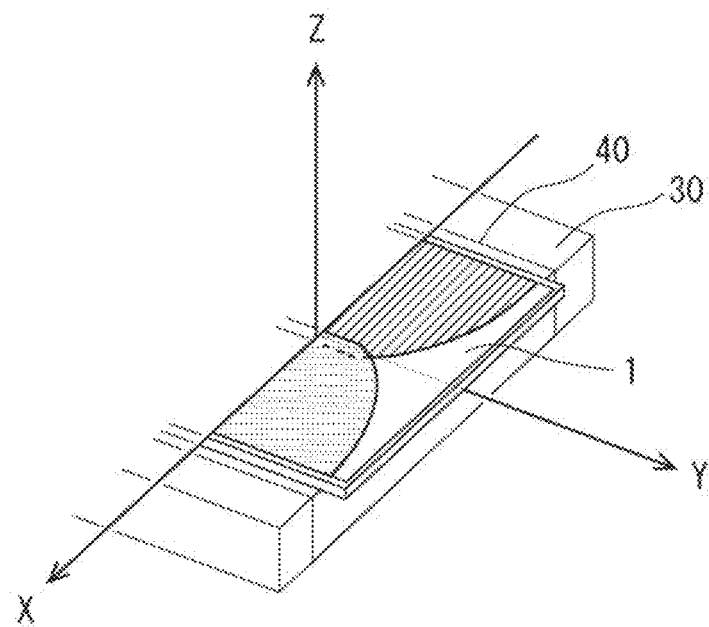
FIG. 7 shows a 3D analysis result of electric field strength of an antenna according to the present disclosure.
Figure 7:
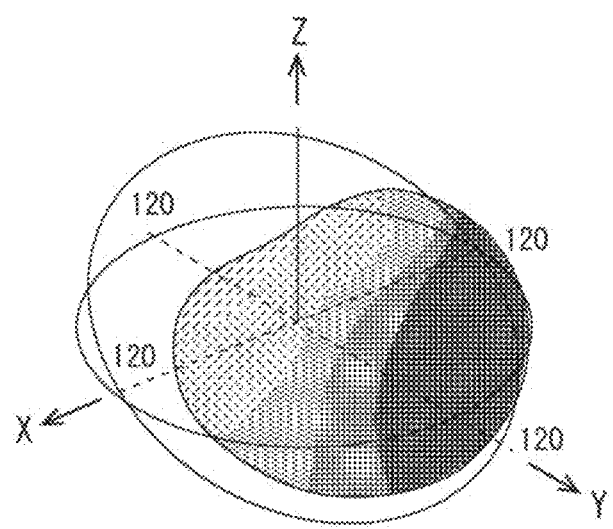
Figure 8:
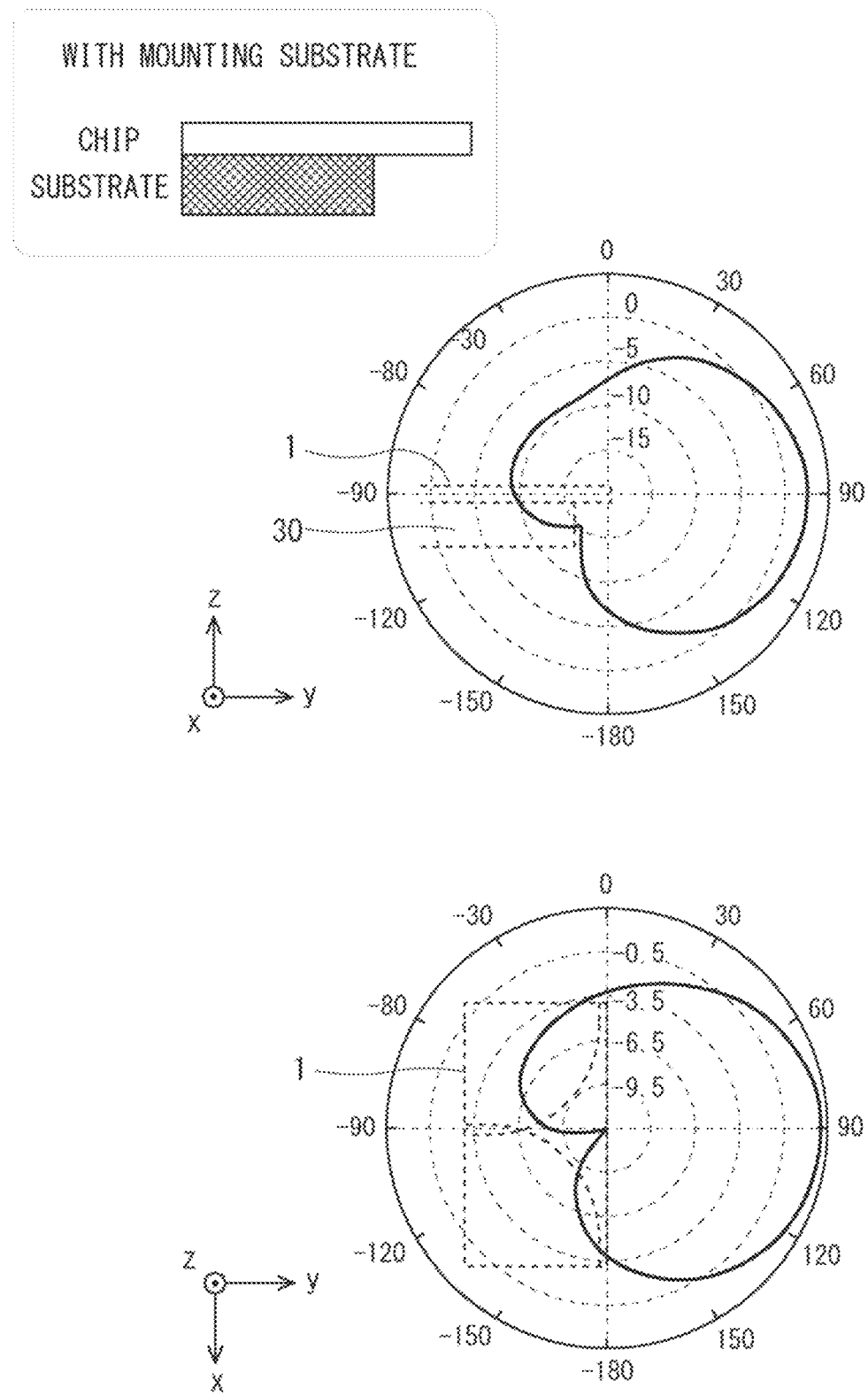
FIG. 8 shows an analysis result of electric field strength of the antenna according to the present disclosure while the antenna is mounted on a printed circuit board.
Figure 9:
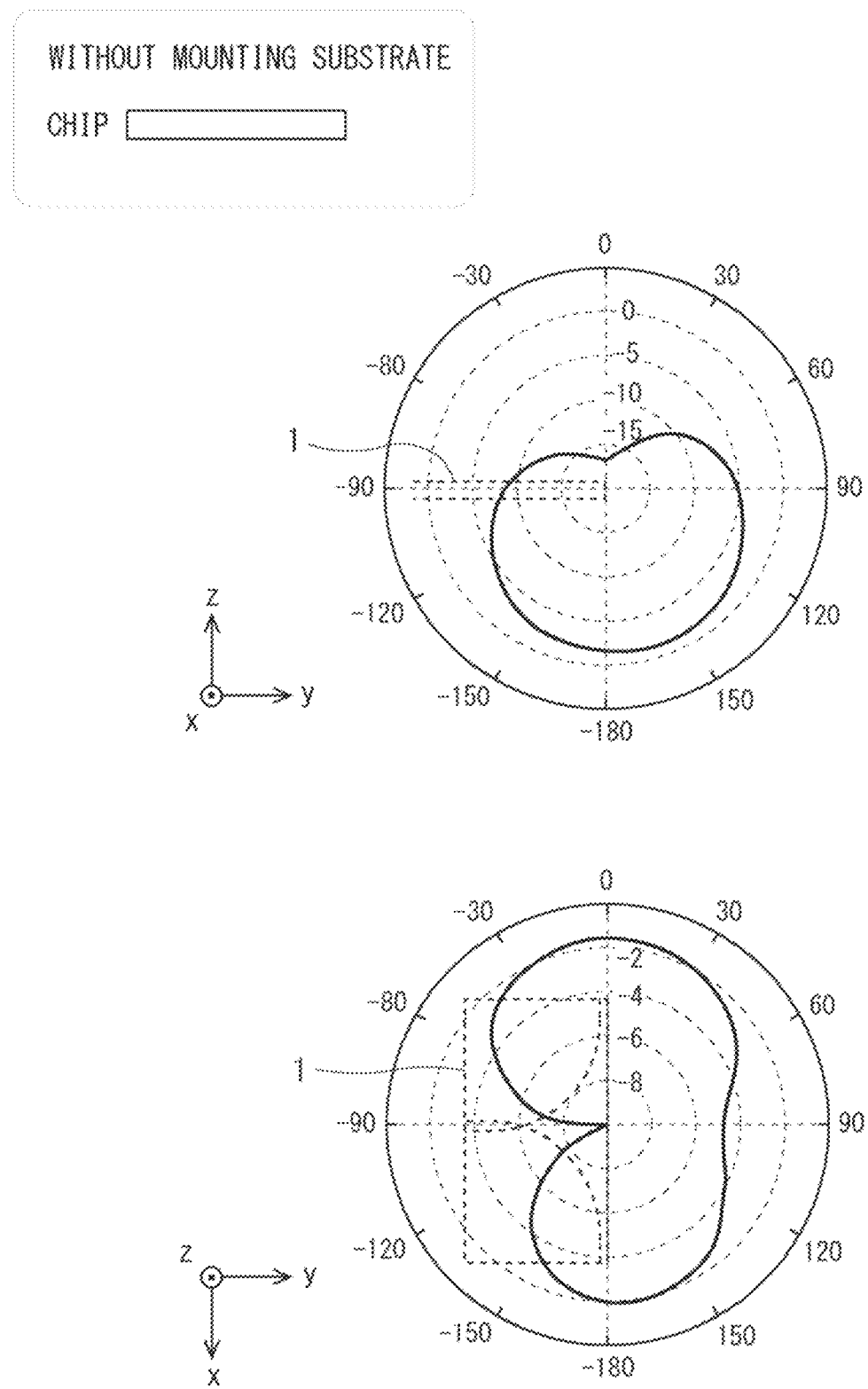
FIG. 9 shows an analysis result of electric field strength of the antenna according to the present disclosure while the antenna is not mounted on a printed circuit board.

FIG. 7 shows a 3D analysis result of electric field strength of the antenna 10 of the semiconductor chip 1 mounted on the printed circuit board 30. FIG. 8 shows an analysis result of the electric field strength of the antenna 10 of the semiconductor chip 1 mounted on the printed circuit board 30 viewed from the upper surface and the side surface of the chip. FIG. 9 shows an analysis result of the electric field strength of the antenna 10 of the semiconductor chip 1 not mounted on the printed circuit board 30 viewed from the upper surface and the side surface of the chip. In the examples of FIGS. 7 to 9, the design frequency is 150 GHz, and the thickness of the semiconductor substrate 101 of the semiconductor chip 1 is 200 um. The solid lines in FIGS. 8 and 9 represent the strength of the electric field radiated from the antenna 10. The scale shown from the center to the periphery in each of FIGS. 8 and 9 indicates the antenna gain.

First, as shown in FIG. 9, the pattern of the electromagnetic field generated by the antenna 10 of the semiconductor chip 1 not mounted on the printed circuit board 30 has no symmetry in front of the chip end E1 (in the y-axis positive direction) in the vertical upward direction (in the z-axis positive direction) and in the vertical downward direction (in the z-axis negative direction) of the chip. That is, the antenna 10 of the semiconductor chip 1 not mounted on the printed circuit board 30 may not be able to radiate wireless signals in a desired direction. However, if the thickness of the semiconductor substrate 101 is small, the bias of the electromagnetic waves to the side of the semiconductor substrate 101 becomes small, so that the antenna 10 of the semiconductor chip 1 not mounted on the printed circuit board 30 can radiate wireless signals in a desired direction.

On the other hand, as shown in FIGS. 7 to 8, the pattern of the electromagnetic field generated by the antenna 10 of the semiconductor chip 1 mounted on the printed circuit board 30 is symmetric in the vertical upward direction and vertical downward direction of the chip in front of the chip end E1. In other words, the antenna 10 of the semiconductor chip 1 mounted on the printed circuit board 30 can radiate wireless signals in a desired direction.

Second Example Embodiment

Figure 10:
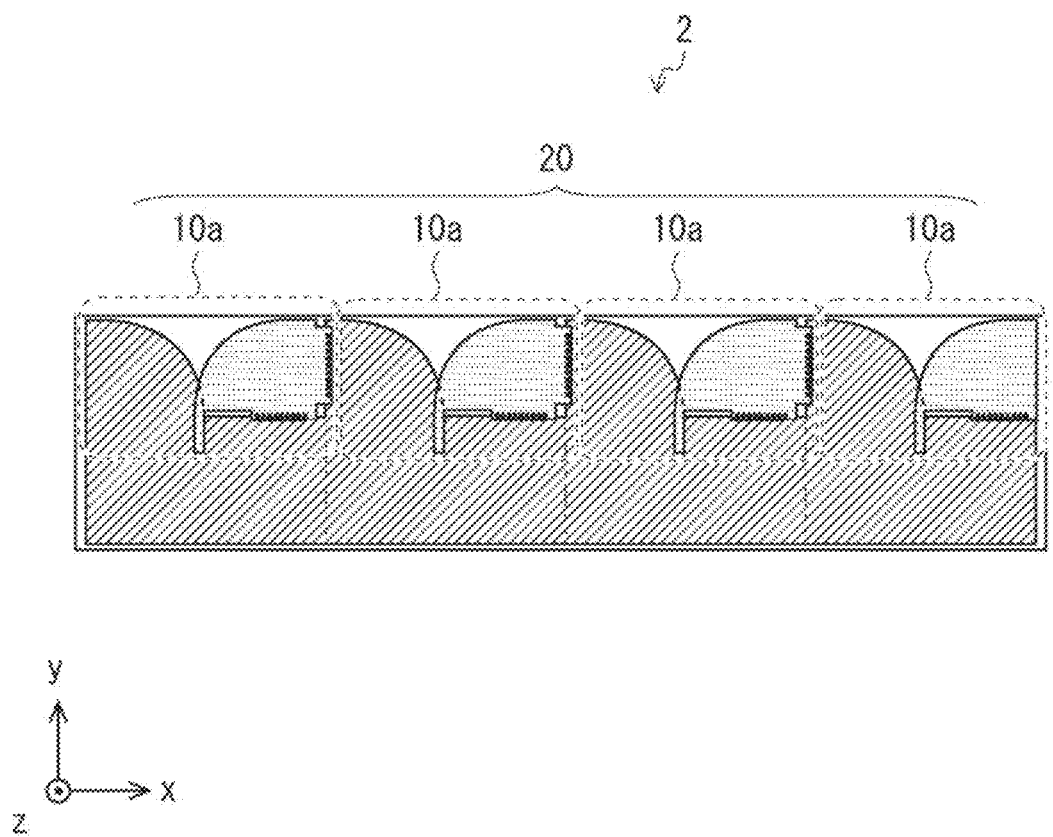
FIG. 10 is a top view showing a configuration example of a semiconductor chip on which an antenna according to the present disclosure is mounted.

FIG. 10 is a top view showing a configuration example of a semiconductor chip 2 on which an antenna (array antenna) 20 according to the present disclosure is mounted.

As shown in FIG. 10, the semiconductor chip 2 includes the antenna 20. The antenna 20 is composed of a plurality of antenna elements 10a each having a structure equivalent to that of the antenna 10. In the example of FIG. 10, the antenna 20 is composed of four antenna elements 10a. The four antenna elements 10a are arranged in an array on one semiconductor substrate so that the radiation direction of electromagnetic waves is the same.

The ground pattern formed in the first wiring layer M1 of one antenna element 10a is continuous with (electrically connected to) the ground pattern formed in the first wiring layer M1 of another adjacent antenna element 10a. The ground pattern formed in the second wiring layer M3 of one antenna element 10a is electrically connected to the ground pattern formed in the first wiring layer M1 of another adjacent antenna element 10a by vias or the like.

As described above, the antenna 20 according to the present disclosure includes the plurality of antenna elements 10a each having a structure equivalent to that of the antenna 10 in an array, so that wireless signals having higher directivity can be radiated in front of the chip end (in the y-axis positive direction).

In this example embodiment, the case where the semiconductor chip 2 includes four antenna elements 10a each having a structure equivalent to that of the antenna 10 in an array has been described as an example, but the present disclosure is not limited to this. The semiconductor chip 2 may include two or more antenna elements 10a each having a structure equivalent to that of the antenna 10 in an array.

In this example embodiment, the case where a plurality of antenna elements 10a are provided on one semiconductor substrate (chip) has been described as an example, but the present disclosure is not limited to this. The plurality of antenna elements 10a may be provided separately on a plurality of semiconductor substrates. Thus, for example, four semiconductor chips 1 may be provided in an array. (Example of Wireless Apparatus 200 to which Semiconductor Chip 2 is Applied)

Figure 11:
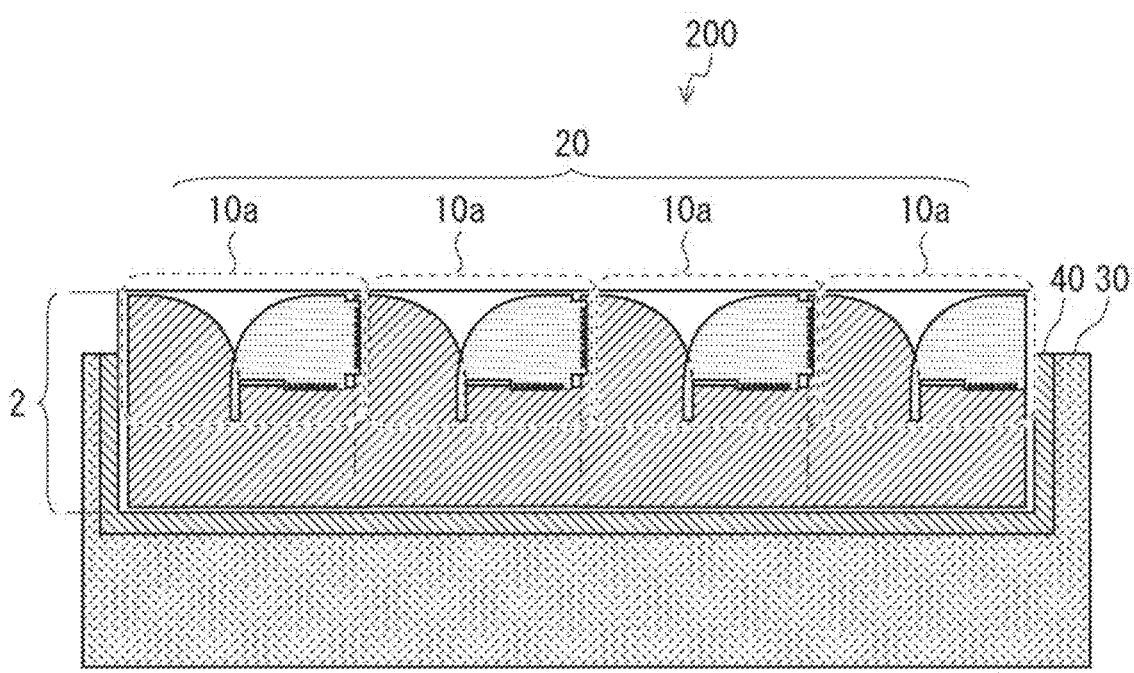
FIG. 11 is a top view showing a configuration example of a wireless apparatus on which a semiconductor chip according to the present disclosure is applied.

FIG. 11 is a top view showing a configuration example of a wireless apparatus 200 to which the semiconductor chip 2 is applied. As shown in FIG. 11, in the wireless apparatus 200, the semiconductor chip 2 is provided on the ground layer 40 formed on the printed circuit board 30. As a result, since the ground layer 40 serves as a reflection material for electromagnetic waves, the antenna 20 provided on the semiconductor chip 2 can radiate wireless signals in a desired direction.

In the wireless apparatus 200, the semiconductor chip 2 is arranged to protrude from the end of the printed circuit board 30. By adjusting the amount of protrusion of the semiconductor chip 2, the pattern of the electromagnetic field generated by the antenna 20 can be adjusted to a desired pattern.

Figure 12:
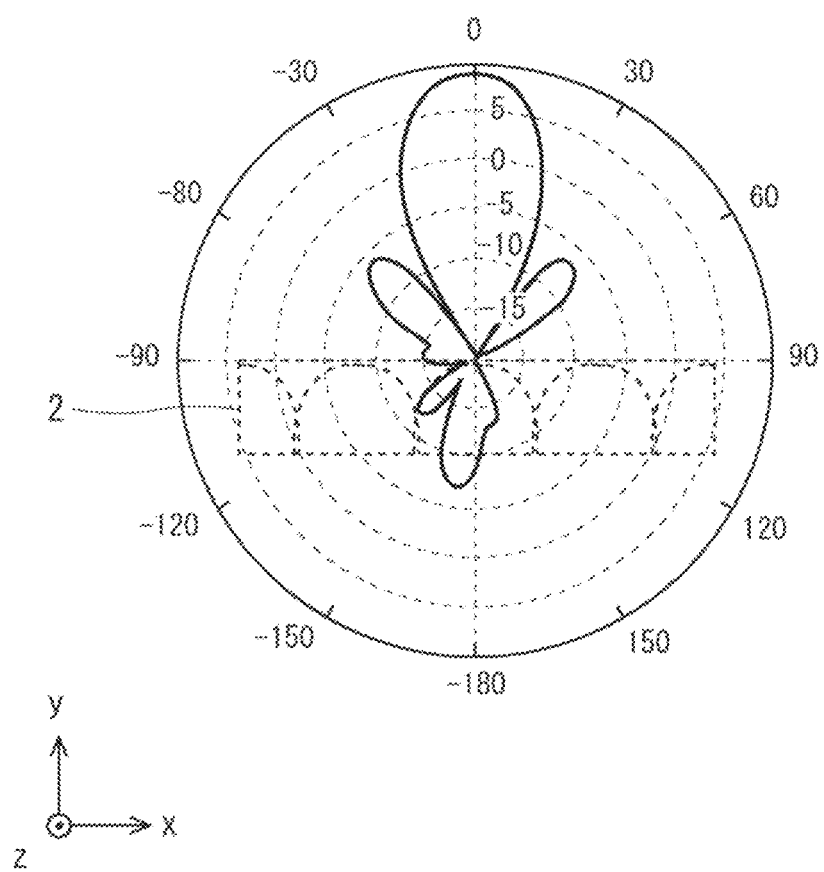
FIG. 12 shows an analysis result of electric field strength of the antenna according to the present disclosure.

FIG. 12 shows an analysis result of electric field strength of the antenna 10 of the semiconductor chip 1 mounted on the printed circuit board 30 viewed from the upper surface of the chip. As shown in FIG. 12, the pattern of the electromagnetic field generated by the antenna 20 of the semiconductor chip 2 mounted on the printed circuit board 30 becomes more directional in front of the chip end by spatial synthesis of the four antenna elements.

As described above, the antenna according to the present disclosure is formed on the semiconductor chip 1 in such a way that the gap of the slot line gradually increases from the central part of the chip toward the chip end. Thus, the antenna according to the present disclosure can realize a small-sized wireless apparatus capable of large-capacity communication using millimeter waves and sub-terahertz waves. Furthermore, since the antenna according to the present disclosure can shorten the transmission path compared with the case where the antenna according to the present disclosure is provided outside the semiconductor chip, power loss can be reduced and the number of components can be reduced.

Moreover, the semiconductor chip on which the antenna according to the present disclosure is mounted is provided on the ground layer of the printed circuit board to protrude from the end of the printed circuit board. This makes it possible to adjust the pattern of the electromagnetic field of the antenna to a desired pattern.

While the present disclosure has been particularly shown and described with reference to example embodiments thereof, the present disclosure is not limited to these example embodiments. It will be understood by those of ordinary skill in the art that various changes in form and details may be made therein without departing from the spirit and scope of the present disclosure as defined by the claims. Each embodiment can be appropriately combined with at least one of embodiments.

Each of the drawings or figures is merely an example to illustrate one or more example embodiments. Each figure may not be associated with only one particular example embodiment, but may be associated with one or more other example embodiments. As those of ordinary skill in the art will understand, various features or steps described with reference to any one of the figures can be combined with features or steps illustrated in one or more other figures, for example, to produce example embodiments that are not explicitly illustrated or described. Not all of the features or steps illustrated in any one of the figures to describe an example embodiment are necessarily essential, and some features or steps may be omitted. The order of the steps described in any of the figures may be changed as appropriate.

The whole or part of the example embodiments disclosed above can be described as, but not limited to, the following supplementary notes.

(Supplementary Note 1)

An antenna at least comprising:
a semiconductor substrate;
a first wiring layer formed on a main surface of the semiconductor substrate;
an insulating layer composed of an insulating film laminated on the first wiring layer; and
a second wiring layer laminated on the insulating layer, the antenna further comprising:
a first ground pattern formed in the first wiring layer to cover a part of a first region of the main surface of the semiconductor substrate; and
a second ground pattern formed in the second wiring layer in such a way that a part of an outer peripheral side of the first ground pattern overlaps a part of an outer peripheral side of the second ground pattern when viewed from above, and the part of the second ground pattern overlapping the first ground pattern is electrically connected to first signal wiring extending from an integrated circuit, wherein
the first ground pattern and the second ground pattern, when viewed from above, are formed to gradually deviate from each other from a region where the first ground pattern overlaps the second ground pattern toward an end region of the semiconductor substrate.

(Supplementary Note 2)

The antenna according to supplementary note 1, further comprising:
a second region between a region where the integrated circuit is formed and the first region on the main surface of the semiconductor substrate;
a third ground pattern formed in the first wiring layer to cover the second region; and
second signal wiring formed in the second wiring layer to connect the first signal wiring to the part of the second ground pattern overlapping the first ground pattern when viewed from above.

(Supplementary Note 3)

The antenna according to supplementary note 2, further comprising a via electrically connecting the second ground pattern to the third ground pattern at a boundary part between the first region and the second region.

(Supplementary Note 4)

The antenna according to supplementary note 3, wherein a gap is formed between the second ground pattern and the third ground pattern when viewed from above.

(Supplementary Note 5)

The antenna according to supplementary note 4, wherein a length of the gap from a connection point between the second signal wiring and the second ground pattern to a connection point between the second ground pattern and the third ground pattern is ¼ wavelength of a wireless signal.

(Supplementary Note 6)

An array antenna comprising a plurality of antenna elements arranged in an array, wherein each of the plurality of antenna elements is the antenna according to supplementary note 1.

(Supplementary Note 7)

A semiconductor chip comprising:
the antenna according to supplementary note 1; and
an integrated circuit formed on the semiconductor substrate.

(Supplementary Note 8)

A wireless apparatus comprising:
a printed circuit board;
a ground layer formed on the printed circuit board; and
a semiconductor chip according to supplementary note 7, wherein the semiconductor chip is provided to protrude from an end of the printed circuit board.

(Supplementary Note 9)

A semiconductor chip comprising:
the array antenna according to supplementary note 6; and
an integrated circuit formed on the semiconductor substrate.

(Supplementary Note 10)

A wireless apparatus comprising:
a printed circuit board;
a ground layer formed on the printed circuit board; and
the semiconductor chip according to supplementary note 9, wherein the ground layer is provided to protrude from an end of the printed circuit board.

According to the present disclosure, it is possible to provide an antenna, an array antenna, a semiconductor chip, and a wireless apparatus that can achieve miniaturization.

The first and second example embodiments can be combined as desirable by one of ordinary skill in the art.

While the disclosure has been particularly shown and described with reference to example embodiments thereof, the disclosure is not limited to these example embodiments. It will be understood by those of ordinary skill in the art that various changes in form and details may be made therein without departing from the spirit and scope of the present disclosure as defined by the claims.

What is claimed is:

1. An antenna at least comprising:
a semiconductor substrate;
a first wiring layer formed on a main surface of the semiconductor substrate;
an insulating layer composed of an insulating film laminated on the first wiring layer; and
a second wiring layer laminated on the insulating layer, the antenna further comprising:
a first ground pattern formed in the first wiring layer to cover a part of a first region of the main surface of the semiconductor substrate; and
a second ground pattern formed in the second wiring layer in such a way that a part of an outer peripheral side of the first ground pattern overlaps a part of an outer peripheral side of the second ground pattern when viewed from above, and the part of the second ground pattern overlapping the first ground pattern is electrically connected to first signal wiring extending from an integrated circuit, wherein
the first ground pattern and the second ground pattern, when viewed from above, are formed to gradually deviate from each other from a region where the first ground pattern overlaps the second ground pattern toward an end region of the semiconductor substrate.

2. The antenna according to claim 1, further comprising:
a second region between a region where the integrated circuit is formed and the first region on the main surface of the semiconductor substrate;
a third ground pattern formed in the first wiring layer to cover the second region; and
second signal wiring formed in the second wiring layer to connect the first signal wiring to the part of the second ground pattern overlapping the first ground pattern when viewed from above.

3. The antenna according to claim 2, further comprising a via electrically connecting the second ground pattern to the third ground pattern at a boundary part between the first region and the second region.

4. The antenna according to claim 3, wherein a gap is formed between the second ground pattern and the third ground pattern when viewed from above.

5. The antenna according to claim 4, wherein a length of the gap from a connection point between the second signal wiring and the second ground pattern to a connection point between the second ground pattern and the third ground pattern is ¼ wavelength of a wireless signal.

6. An array antenna comprising a plurality of antenna elements arranged in an array, wherein each of the plurality of antenna elements is the antenna according to claim 1.

7. A semiconductor chip comprising:
the antenna according to claim 1; and
an integrated circuit formed on the semiconductor substrate.

8. A wireless apparatus comprising:
a printed circuit board;
a ground layer formed on the printed circuit board; and
a semiconductor chip according to claim 7, wherein the semiconductor chip is provided to protrude from an end of the printed circuit board.

9. A semiconductor chip comprising:
the array antenna according to claim 6; and
an integrated circuit formed on the semiconductor substrate.

10. A wireless apparatus comprising:
a printed circuit board;
a ground layer formed on the printed circuit board; and
the semiconductor chip according to claim 9, wherein the ground layer is provided to protrude from an end of the printed circuit board.

* * * * *